United States Patent
Fukami

(10) Patent No.: US 9,476,934 B2
(45) Date of Patent: Oct. 25, 2016

(54) INSPECTION APPARATUS AND INSPECTION METHOD FOR INSPECTING A WIRING BOARD

(71) Applicant: Kabushiki Kaisha Nihon Micronics, Tokyo (JP)

(72) Inventor: Yoshiyuki Fukami, Ibaraki (JP)

(73) Assignee: KABUSHIKI KAISHA NIHON MICRONICS, Tokyo (JP)

( * ) Notice: Subject to any disclaimer, the term of this patent is extended or adjusted under 35 U.S.C. 154(b) by 233 days.

(21) Appl. No.: 14/261,480

(22) Filed: Apr. 25, 2014

(65) Prior Publication Data
US 2014/0375351 A1 Dec. 25, 2014

(30) Foreign Application Priority Data

Jun. 21, 2013 (JP) ................................ 2013-130959

(51) Int. Cl.
G01R 31/28 (2006.01)

(52) U.S. Cl.
CPC ....... *G01R 31/2822* (2013.01); *G01R 31/2808* (2013.01); *G01R 31/2801* (2013.01); *G01R 31/2805* (2013.01); *G01R 31/2812* (2013.01); *G01R 31/2818* (2013.01)

(58) Field of Classification Search
CPC ..................... G01R 21/2808; G01R 31/2818; G01R 31/2801; G01R 31/2805; G01R 31/2812
USPC .................................................. 324/763.01
See application file for complete search history.

(56) References Cited

U.S. PATENT DOCUMENTS

| | | | | |
|---|---|---|---|---|
| 7,129,729 B2* | 10/2006 | Ho | ..................... | G01R 31/2896 324/756.02 |
| 7,132,834 B2* | 11/2006 | Tesdahl | ................ | G01R 31/312 324/519 |
| 7,138,805 B2* | 11/2006 | Ishioka | .............. | G01R 31/2805 257/E21.53 |
| 7,145,351 B2* | 12/2006 | Mizoguchi | ......... | G01R 31/2808 324/538 |

(Continued)

FOREIGN PATENT DOCUMENTS

| | | |
|---|---|---|
| JP | 2003-207535 A | 7/2003 |
| JP | 2004-361249 A | 12/2004 |
| KR | 10-2013-0037641 A | 4/2013 |

OTHER PUBLICATIONS

Korean Patent Office, Office Action in Korean Patent Application No. 2014-42373 (Mar. 6, 2015).

*Primary Examiner* — Jermele M Hollington
*Assistant Examiner* — Christopher McAndrew
(74) *Attorney, Agent, or Firm* — Leydig, Voit & Mayer, Ltd.

(57) ABSTRACT

An inspection apparatus for inspecting a wiring board having an opposing electrode facing an upper face of the wiring board, a capacitance meter electrically connected to the opposing electrode and the multi-layer wiring, and measuring capacitance between the opposing electrode and the multi-layer wiring, ground, a switch box that is connected to the ground wirings, the opposing electrode, and the ground, and switches to select between a first connection state, in which all the ground wirings are electrically connected to the opposing electrode, and a second connection state, in which one ground wiring is electrically connected to the ground. A control unit extracts a capacitance value by calculating difference between a first capacitance and a second capacitance, wherein capacitance in units of layers of the multi-layer wiring are measured based on the capacitance value extracted by the control unit.

12 Claims, 4 Drawing Sheets

(56) References Cited

U.S. PATENT DOCUMENTS

| | | | | |
|---|---|---|---|---|
| 7,250,785 B2 * | 7/2007 | Kawaike | ............... | G01R 31/315 324/754.29 |
| 7,355,385 B2 * | 4/2008 | Zentai | ................ | G01R 31/2812 324/537 |
| 2001/0028256 A1 * | 10/2001 | Hayashi | ............... | G01R 31/312 324/754.21 |
| 2006/0006894 A1 * | 1/2006 | Ho | .................... | G01R 31/2896 324/756.02 |
| 2007/0024272 A1 * | 2/2007 | Zentai | ................ | G01R 31/2812 324/763.01 |
| 2007/0081380 A1 * | 4/2007 | Atwood | ................ | G11C 11/405 365/150 |
| 2007/0257690 A1 * | 11/2007 | Oshetski | ........... | G01R 1/07328 324/750.25 |
| 2008/0012593 A1 * | 1/2008 | Shimoda | ............ | G01R 1/07335 324/755.09 |
| 2011/0241721 A1 * | 10/2011 | Schroeter | ........... | G01R 31/2808 324/763.01 |
| 2012/0049885 A1 * | 3/2012 | Monda | ................ | G01R 31/043 324/763.01 |
| 2012/0146726 A1 * | 6/2012 | Huang | ............... | G01R 27/2605 330/257 |
| 2012/0306529 A1 * | 12/2012 | Omori | ................ | G01R 31/048 324/763.01 |

* cited by examiner

INSPECTION APPARATUS AND INSPECTION METHOD FOR INSPECTING A WIRING BOARD

CROSS-REFERENCE TO RELATED APPLICATIONS

The entire disclosure of the Japanese Patent Application No. 2013-130959, filed on Jun. 21, 2013 including specification, claims, drawings, and summary, on which the Convention priority of the present application is based, is incorporated herein in its entirety.

FIELD OF THE INVENTION

The present invention relates to an inspection apparatus for a wiring board and a method of inspecting a wiring board.

BACKGROUND

As the implementation of high-speed signal transmission in a mounting circuit board progresses, impedance matching of a multi-layer wiring board becomes more important. In a transmission line for electrical signals, in a case where the output-side voltage is constant, by configuring the output impedance of the circuit and the input impedance of a reception-side circuit to be the same, power acquired at the reception-side circuit becomes a maximum. Accordingly, in order to efficiently transmit an electrical signal, such impedances need to be the same (that is, to match each other).

In a wiring board, in order to match the impedances, it is important that resistance, reactance, and conductance (capacitance) of the wiring board should be manufactured to have designated expectation values.

However, in the case of the multi-layer wiring board, in a stage in which the manufacturing thereof is completed, it is difficult to measure and check the conductance (hereinafter, also referred to as capacitance) that is a constituent element in units of layers configuring the multi-layer wiring board.

For example, as disclosed in U.S. Pat. No. 3,603,850, in inspecting a multi-layer wiring board, an inspection method has been known in which the quality of an electric wiring is determined by measuring capacitance generated between the wiring to be inspected and an electrode opposing the wiring.

FIG. 4 is a schematic cross-sectional diagram that illustrates a conventional method of inspecting a multi-layer wiring board.

In the conventional inspection method illustrated in FIG. 4, a wiring board 1101 to be inspected includes an electric wiring 1120 that is configured by a lower layer wiring 1121 and an upper layer wiring 1122 inside the board and has a multi-layer wiring structure. The opposing electrode 1102 is arranged to face the wiring board 1101. The size of the opposing electrode 1102 covers the entire wiring board 1101 and is electrically connected to a capacitance meter 1110 in a part thereof.

In addition, the capacitance meter 1110 is electrically connected to a terminal 1123 or a terminal 1124 disposed on the electric wiring 1120 of the wiring board 1101.

In the inspection method illustrated in FIG. 4, the quality of the electric wiring 1120 is determined by measuring capacitance between the electric wiring 1120 and the opposing electrode 1102 using the capacitance meter 1110, wherein the electric wiring 1120 is arranged to face the opposing electrode 1102.

More specifically, in a case where a short-circuit defect does not occur in the electric wiring 1120, the capacitance measured by the capacitance meter 1110 is a combined capacitance that is acquired by combining capacitance C100 between the lower layer wiring 1121 configuring the electric wiring 1120 and the opposing electrode 1102 and capacitance C200 between the upper layer wiring 1122 configuring the electric wiring 1120 and the opposing electrode 1102. Since the capacitance is the same as a designated expectation value, the electric wiring 1120 can be determined as a non-defective product.

On the other hand, for example, when there is a short-circuit defect between the lower layer wiring 1121 and the upper layer wiring 1122, in a case where the capacitance meter 1110 is connected to the terminal 1123, only the capacitance C100 between the lower layer wiring 1121 and the opposing electrode 1102 is measured. In addition, in a case where the capacitance meter 1110 is connected to the terminal 1124, only the capacitance C200 between the upper layer wiring 1122 and the opposing electrode 1102 is measured. In any of the cases, the measured capacitance is smaller than the combined capacitance of the capacitance C100 and the capacitance C200 that is an expectation value, and accordingly, the occurrence of a short-circuit defect in the electric wiring 1120 can be detected.

In this way, in the conventional inspection method, the measurement of capacitance using the opposing electrode is effective in a case where the quality of the electric wiring of the multi-layer wiring board is to be determined.

However, the conventional method of inspecting a wiring board through the measurement of capacitance is a method in which such combined capacitance is measured instead of measuring the capacitance in units of layers of the multi-layer wiring structure. In other words, the conventional inspection method is not for the purpose of measuring capacitance in units of layers of the electric wiring, and, in the conventional inspection method, while capacitance is measured using the opposing electrode, the capacitance in units of layers cannot be measured.

As described above, in a wiring board, in order to match the impedances, it is important that the capacitance value is produced according to a designated value. Further, it is a requirement to check whether the capacitance value is produced according to the designated value or not, and if required, the result of the checking process is to be fed back to the production process. However, the method of inspecting a wiring board and the like that are conventionally known cannot be applied to such a checking process.

In other words, in a case where capacitance of each layer unit of a wiring board having a multi-layer wiring structure is to be checked, a conventional inspection apparatus for a wiring board or a conventional inspection method in which capacitance is measured using an opposing electrode cannot be used.

As described above, in the case of the wiring board having a multi-layer wiring structure, in a stage in which the board is completed, it is difficult to measure capacitance that is a constituent element thereof in units of layers configuring the wiring board using a conventional method. Accordingly, in the wiring board, in order to match the impedances, the wiring board is required to be manufactured to have a designed capacitance value. However, after the wiring board is manufactured, it is difficult to check whether or not the capacitance has an expected value. As a result, in a case where the capacitance of the wiring board deviates from the expected value, there is a problem in that it is difficult to improve the manufacturing condition and the like by having such a deviation to be fed back to the manufacturing process of the wiring board.

Thus, a method of inspecting a wiring board having a multi-layer wiring structure in which capacitance that is a constituent element is measured in units of layers configuring the wiring board in a stage in which the wiring board is completed and an inspection apparatus for a wiring board that realizes the method have been requested. In addition, a technique for enabling the manufacturing of a wiring board having an expected capacitance value by having a measurement result to be fed back to the manufacturing process of the wiring board has been requested.

The present invention has been contrived in consideration of such problems.

In other words, an object of the present invention is to provide an inspection apparatus for a wiring board that measures capacitance in units of layers of the wiring board having a multi-layer wiring structure.

In addition, another object of the present invention is to provide a method of inspecting a wiring board for measuring capacitance in units of layers of the wiring board having a multi-layer wiring structure.

The other objects and advantages of the present invention become clear in the following description.

SUMMARY OF INVENTION

According to one aspect of the present invention, an inspection apparatus for a wiring board that inspects the wiring board including a multi-layer wiring having a multi-layer structure that is formed by electrically connecting wirings of a plurality of mutually-different layers from an uppermost layer to a lowermost layer and at least one or more ground wirings that are formed near a wiring other than a wiring of the uppermost layer of the multi-layer wiring to be electrically insulated from the multi-layer wiring, the inspection apparatus comprising, an opposing electrode that is arranged to face an upper face of the wiring board, a capacitance meter that is electrically connected to the opposing electrode and the multi-layer wiring and measures capacitance between the opposing electrode and the multi-layer wiring, an earth, a switch box that is connected to the ground wirings, the opposing electrode, the earth, and performs switching to select between a first connection state in which all the ground wirings are electrically connected to the opposing electrode and a second connection state in which one ground wiring is electrically connected to the earth, and a control unit that is configured to extract a capacitance value by calculating a difference between first capacitance that is measured in the first connection state by the capacitance meter and second capacitance that is measured in the second connection state by the capacitance meter, wherein capacitance in units of layers of the multi-layer wiring is configured to be measured based on the capacitance value extracted by the control unit.

Further to this aspect of the present invention, an inspection apparatus, wherein the control unit is configured to be connected to the capacitance meter and store the capacitance measured using the capacitance meter.

Further to this aspect of the present invention, an inspection apparatus, wherein the control unit is configured to be connected to the switch box and control switching between the first connection state and the second connection state in the switch box.

Further to this aspect of the present invention, an inspection apparatus, wherein there are a plurality of the ground wirings, and one of these ground wirings is arranged near each wiring other than the wiring of the uppermost layer of the multi-layer wiring to be electrically insulated from the multi-layer wiring, wherein the second connection state includes a plurality of connection states in which one ground wiring is electrically connected to the earth, and the remaining ground wirings are electrically connected to the opposing electrode, and the switch box performs switching to select one connection state among the first connection state and the plurality of second connection states in which the ground wirings electrically connected to the earth are different from one another, and wherein the control unit extracts the capacitance value by calculating a difference between the first capacitance and the second capacitance that is measured in one of the plurality of the second connection states by the capacitance meter.

Further to this aspect of the present invention, an inspection apparatus, wherein the multi-layer wiring of the wiring board has a two-layer wiring structure that is formed by a lower layer wiring and an upper layer wiring, one ground wiring disposed near the lower layer wiring, wherein the first connection state is a state in which the one ground wiring is electrically connected to the opposing electrode, wherein the second connection state is a state in which the one ground wiring is electrically connected to the earth, and wherein the control unit extracts the capacitance value by calculating a difference between the first capacitance and the second capacitance that is measured in the second connection state by the capacitance meter.

According to another aspect of the present invention, a method of inspecting a wiring board that inspects the wiring board including a multi-layer wiring having a multi-layer structure that is formed by electrically connecting wirings of a plurality of mutually-different layers from an uppermost layer to a lowermost layer and at least one or more ground wirings that are formed near a wiring other than a wiring of the uppermost layer of the multi-layer wiring to be electrically insulated from the multi-layer wiring, the method comprising, arranging an opposing electrode to face an upper face of the wiring board, arranging a switch box that is connected to the ground wirings, the opposing electrode, an earth, and performs switching to select between a first connection state in which all the ground wirings are electrically connected to the opposing electrode and a second connection state in which one ground wiring is electrically connected to the earth, and measuring first capacitance in the first connection state by performing switching of the wiring using the switch box, measuring second capacitance in the second connection state by performing switching of the wiring using the switch box, and measuring capacitance in units of layers of the multi-layer wiring by extracting a capacitance value by calculating a difference between the first capacitance and the second capacitance.

Further to this aspect of the present invention, a method wherein there are a plurality of the ground wirings, and one of the ground wirings is arranged near each wiring other than the wiring of the uppermost layer of the multi-layer wiring to be electrically insulated from the multi-layer wiring, wherein the second connection state includes a plurality of connection states in which one ground wiring is electrically connected to the earth, and the remaining ground wirings are electrically connected to the opposing electrode, and the switch box to perform switching to select one connection state among the first connection state and the plurality of second connection states in which the ground wirings electrically connected to the earth are different from one another, wherein the measuring of the second capacitance is performed for each one of the plurality of the second connection states in which the ground wirings electrically connected to the earth are different from one another by performing switching between wirings using the switch box, a plurality of types of the second capacitance are acquired, and wherein the extracting of the capacitance value is performed a plurality of times using the first capacitance and each one of the plurality of the second capacitance, and capacitance in units of layers of the multi-layer wiring is configured to be measured based on a plurality of the extracted capacitance values.

Further to this aspect of the present invention, a method wherein the multi-layer wiring of the wiring board has a two-layer wiring structure that is formed by a lower layer wiring and an upper layer wiring, and there is one ground wiring disposed near the lower layer wiring, wherein the first connection state is a state in which the one ground wiring is electrically connected to the opposing electrode, and wherein the second connection state is a state in which the one ground wiring is electrically connected to the earth.

DETAILED DESCRIPTION OF EMBODIMENTS

First Embodiment

Hereinafter, an inspection apparatus for a wiring board according to a first embodiment of the present invention will be described with reference to the drawings.

Figure 1:
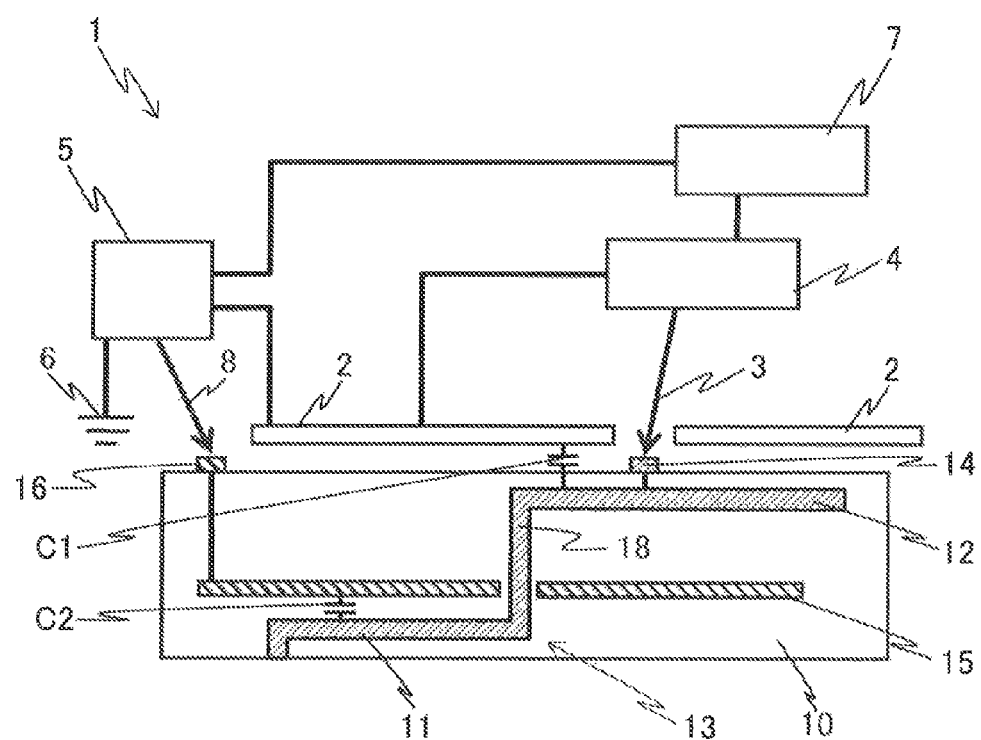
FIG. 1 is a diagram that illustrates the configuration of an inspection apparatus for a wiring board according to a first embodiment of the present invention.

FIG. 1 is a diagram that illustrates the configuration of the inspection apparatus for a wiring board according to the first embodiment of the present invention.

As illustrated in FIG. 1, an inspection apparatus 1 for a wiring board according to the first embodiment of the present invention may have a wiring board having a multi-layer wiring structure as an inspection target. In other words, the inspection apparatus 1 may have a wiring board including multi-layer wirings having a multi-layer structure that is formed by electrically connecting wirings of a plurality of layers that are mutually-different layers from the uppermost layer to the lowermost layer as an inspection target. A multi-layer wiring board 10 illustrated in FIG. 1 is an example of the wiring board having a multi-layer wiring structure that is an inspection target. The inspection apparatus 1 for a wiring board according to the first embodiment of the present invention is configured to measure capacitance that is a constituent element of the multi-layer wiring board 10 in units of layers configuring the multi-layer wiring board 10 and thus is capable of inspecting the multi-layer wiring board 10.

As illustrated in FIG. 1, the inspection apparatus 1 for a wiring board according to the first embodiment of the present invention is configured to have: an opposing electrode 2; a measurement needle 3; a capacitance meter 4; a switch box 5, an earth 6; a control unit 7; and a GND measurement needle 8.

In the multi-layer wiring board 10 that is an inspection target, a board is configured by using a material having an insulating property, and an electric wiring 13 configured by a lower layer wiring 11 disposed on the lower layer side in FIG. 1 and an upper layer wiring 12 disposed on the upper layer side is included inside the board so as to have a two-layer wiring structure. In other words, the electric wiring 13 is configured by electrically connecting the upper layer wiring 12 and the lower layer wiring 11 of mutually-different two layers, which are arranged apart from each other, from the uppermost layer to the lowermost layer through a connection portion 18 having conductivity. The electric wiring 13 is an example of the multi-layer wiring having a multi-layer structure. On the upper face of the multi-layer wiring board 10, a measurement terminal 14 is disposed, and the measurement terminal 14 is electrically connected to the upper layer wiring 12 of the electric wiring 13 inside the board.

In addition, the multi-layer wiring board 10 includes a wiring that is formed to be electrically insulated from the electric wiring 13 inside the board. The multi-layer wiring board 10 uses a wiring disposed inside the board to be electrically insulated from the electric wiring 13 as an inner-layer ground layer 15 serving as a ground wiring. The inner-layer ground layer 15 is disposed near the lower layer wiring 11 except for the upper layer wiring 12 disposed in the uppermost layer of the electric wiring 13. In other words, the inner-layer ground layer 15 is separately formed to be electrically insulated from the electric wiring 13 near the lower layer wiring 11. Accordingly, a distance between the inner-layer ground layer 15 and the upper layer wiring 12 is much longer than a distance between the inner-layer ground layer 15 and the lower layer wiring 11. The inner-layer ground layer 15 is electrically connected to a GND measurement terminal 16 disposed on the upper face of the multi-layer wiring board 10.

In the inspection apparatus 1 for a wiring board according to this embodiment, the opposing electrode 2 is used while disposed to face the multi-layer wiring board 10. More specifically, the opposing electrode 2 is arranged to face the upper face of the multi-layer wiring board 10. The opposing electrode 2 is formed by using a conductive material having a size sufficiently covering the multi-layer wiring board 10. The opposing electrode 2 is formed using a metal plate, as one example. The opposing electrode 2 is electrically connected to the capacitance meter 4.

The measurement needle 3 is used with the tip end thereof being in contact with the electrode. For example, the measurement needle 3 is used while in contact with the measurement terminal 14 of the multi-layer wiring board 10. In addition, the measurement needle 3 is connected to the capacitance meter 4 on one side. Accordingly, the measurement needle 3 can electrically connect the electrode of the inspection target and the capacitance meter 4 to each other.

The capacitance meter 4 is a measurement apparatus used for measuring capacitance. The capacitance meter 4 is electrically connected to the opposing electrode 2 and can measure the capacitance between the opposing electrode 2 and the electrode connected through the measurement needle 3. More specifically, the capacitance meter 4 is electrically connected to the opposing electrode 2 and the electric wiring 13 and can measure the capacitance between the opposing electrode 2 and the electric wiring 13.

In the inspection apparatus 1 according to this embodiment, the switch box 5 is configured to switch between wirings so that capacitance can be measured using a desired method. In other words, the switch box 5 is connected to the opposing electrode 2, is connected to the earth 6, and is connected to the GND measurement needle 8. The GND measurement needle 8 is used with the tip end thereof being in contact with the GND measurement terminal 16 of the multi-layer wiring board 10 of the inspection target and can electrically connect the switch box 5 and the inner-layer ground layer 15 of the multi-layer wiring board 10 to each other.

The switch box 5 is configured to be able to select an electrical connection between the opposing electrode 2 and the GND measurement needle 8 or an electrical connection between the earth 6 and the GND measurement needle 8 in a switchable manner. Accordingly, the inspection apparatus 1 according to this embodiment can select a first connection state in which the inner-layer ground layer 15 and the opposing electrode 2 are electrically connected to each other or a second connection state in which the inner-layer ground layer 15 of the multi-layer wiring board 10 and the earth 6 are electrically connected to each other in a switchable manner by using the switch box 5.

In addition, in the inspection apparatus 1 according to this embodiment, the above-described switching between wirings in the switch box 5 is configured so as to be controlled by the control unit 7 to be described below.

The control unit 7 of the inspection apparatus 1 according to this embodiment is connected to the capacitance meter 4 and the switch box 5. The control unit 7 has a function as a control apparatus that controls the above-described switching between wirings in the switch box 5. In addition, the control unit 7 has a function as a storage apparatus that stores capacitance measured by using the capacitance meter 4. Furthermore, the control unit 7 has a function as a difference calculation apparatus that calculates a difference by using predetermined capacitance that is stored and extracts a desired capacitance value.

In other words, the control unit 7 selects the switching between wirings by controlling the switch box 5. As a result, the first connection state can be formed in which the GND measurement needle 8 and the opposing electrode 2 are electrically connected to each other, and the inner-layer ground layer 15 of the multi-layer wiring board 10 and the opposing electrode 2 are electrically connected to each other. After the capacitance meter 4 measures the capacitance between the opposing electrode 2 and the electric wiring 13 of the multi-layer wiring board 10 in the first connection state, the control unit 7 sets the acquired capacitance value as a first capacitance and stores the capacitance value, for example, as a retention value A.

In addition, the control unit 7 forms the above-described second connection state in which the earth 6 and the GND measurement needle 8 are electrically connected to each other, and the inner-layer ground layer 15 of the multi-layer wiring board 10 and the earth 6 are electrically connected to each other by switching between wirings by controlling the switch box 5. Then, after the capacitance meter 4 measures capacitance between the opposing electrode 2 and the electric wiring 13 of the multi-layer wiring board 10 in the second connection state, the control unit 7 sets the acquired capacitance value as a second capacitance and stores the second capacitance as a retention value B, as one example.

The control unit 7 has a function for calculating a difference between the stored retention values A and B described above and can extract a desired capacitance value from the retention value A that is the first capacitance and the retention value B that is the second capacitance.

The inspection apparatus 1 according to this embodiment having the above-described configuration can measure and evaluate the capacitance of the multi-layer wiring board 10 having the two-layer wiring structure in units of layers.

In other words, according to the inspection apparatus 1 of this embodiment, the first connection state can be formed in which the opposing electrode 2 and the inner-layer ground layer 15 are electrically connected to each other by controlling the switching between wirings using the switch box 5 controlled by the control unit 7. Then, the capacitance between the opposing electrode 2 and the electric wiring 13 of the multi-layer wiring board 10 can be measured by the capacitance meter 4 in the connection state. At this time, the measured capacitance is a combined capacitance of the capacitance C1 generated between the upper layer wiring 12 of the electric wiring 13 and the opposing electrode 2 and the capacitance C2 generated between the lower layer wiring 11 and the inner-layer ground layer 15. Then, the measured combined capacitance can be stored in the control unit 7 as the above-described retention value A.

In addition, at this time, capacitance is generated between the upper layer wiring 12 and the inner-layer ground layer 15. However, as described above, the distance between the upper layer wiring 12 and the inner-layer ground layer 15 is much longer than the distance between the lower layer wiring 11 and the inner-layer ground layer 15. Accordingly, the capacitance generated between the upper layer wiring 12 and the inner-layer ground layer 15 is extremely low and can therefore be ignored.

Similarly, capacitance is generated between the lower layer wiring 11 and the opposing electrode 2. However, a distance between the lower layer wiring 11 and the opposing electrode 2 is much longer than a distance between the upper layer wiring 12 and the opposing electrode 2. Accordingly, the capacitance generated between the lower layer wiring 11 and the opposing electrode 2 is extremely low and can therefore be ignored.

In addition, according to the inspection apparatus 1 of this embodiment, the second connection state can be formed in which the earth 6 and the inner-layer ground layer 15 are electrically connected to each other by controlling the switching between wirings using the switch box 5 controlled by the control unit 7. Then, the capacitance between the opposing electrode 2 and the electric wiring 13 of the multi-layer wiring board 10 is measured by the capacitance meter 4 in the connection state. At this time, the measured capacitance value is the capacitance C1 generated between the upper layer wiring 12 of the electric wiring 13 and the opposing electrode 2. Since the inner-layer ground layer 15 is connected to the earth 6 through the GND measurement terminal 16 and the GND measurement needle 8, the capacitance C2 generated between the lower layer wiring 11 and the inner-layer ground layer 15 is not measured. Then, the acquired capacitance value is stored in the control unit 7 as the above-described retention value B.

Since the capacitance C2 is zero, the retention value B that is the second capacitance stored in the control unit 7 is the capacitance C1 of the upper layer wiring 12 of the electric wiring 13. In other words, the capacitance of the upper layer wiring 12 of the multi-layer wiring board 10 can be acquired. The control unit 7 can extract the capacitance C2 of the lower layer wiring 11 of the electric wiring 13 by calculating a difference between the retention value A, which is the first capacitance, and the retention value B, which is the second capacitance, that are stored. In other words, the capacitance of the lower layer wiring 11 of the multi-layer wiring board 10 can be acquired.

As a result, the inspection apparatus 1 according to this embodiment can evaluate capacitance of the multi-layer wiring board 10 having the electric wiring 13 that has the two-layer wiring structure configured by the lower layer wiring 11 and the upper layer wiring 12 in units of layers.

As above, the inspection apparatus 1 for a wiring board according to this embodiment measures capacitance a plurality of times by switching between wiring connections inside the switch box 5 using the capacitance meter 4, whereby capacitance values of the multi-layer wiring board 10 in units of layers can be measured. Then, the measured capacitance values can be used for checking whether or not the capacitance values in units of layers after the completion of the wiring board are designed designated expectation values.

As a result, as one example, in a case where a capacitance value of the layer, which has the multi-layer wiring structure, of the wiring board deviates from a designated expectation value or the like, as is necessary, information can be fed back to the manufacturing process of the wiring board. The feedback information may be used for improving and optimizing the manufacturing process of the wiring board.

Next, a method of inspecting a wiring board according to a second embodiment of the present invention that is performed using the inspection apparatus 1 according to this embodiment will be described with reference to FIG. 1 and FIG. 2.

Second Embodiment

The method of inspecting a wiring board according to the second embodiment of the present invention may have a wiring board having a multi-layer wiring structure as an inspection target by using the inspection apparatus 1 for a wiring board according to the first embodiment of the present invention illustrated in FIG. 1. In other words, the inspection target of the inspection method according to this embodiment may be a wiring board that has multi-layer wirings having a multi-layer structure formed by electrically connecting wirings of a plurality of mutually-different layers from the uppermost layer to the lowermost layer inside the board.

The method of inspecting a wiring board according to this embodiment may have, as illustrated in FIG. 1, for example, the multi-layer wiring board 10 having the two-layer wiring structure as an inspection target. The multi-layer wiring board 10 having the two-layer wiring structure is an example of the wiring board having a multi-layer wiring structure that is the target for the inspection method according to the present invention. According to the method of inspecting a wiring board according to the second embodiment of the present invention, capacitance that is a constituent element of the multi-layer wiring board 10 can be measured and evaluated in units of layers configuring the multi-layer wiring board 10 by using the inspection apparatus 1 according to the first embodiment, whereby the multi-layer wiring board 10 is inspected.

Figure 2:
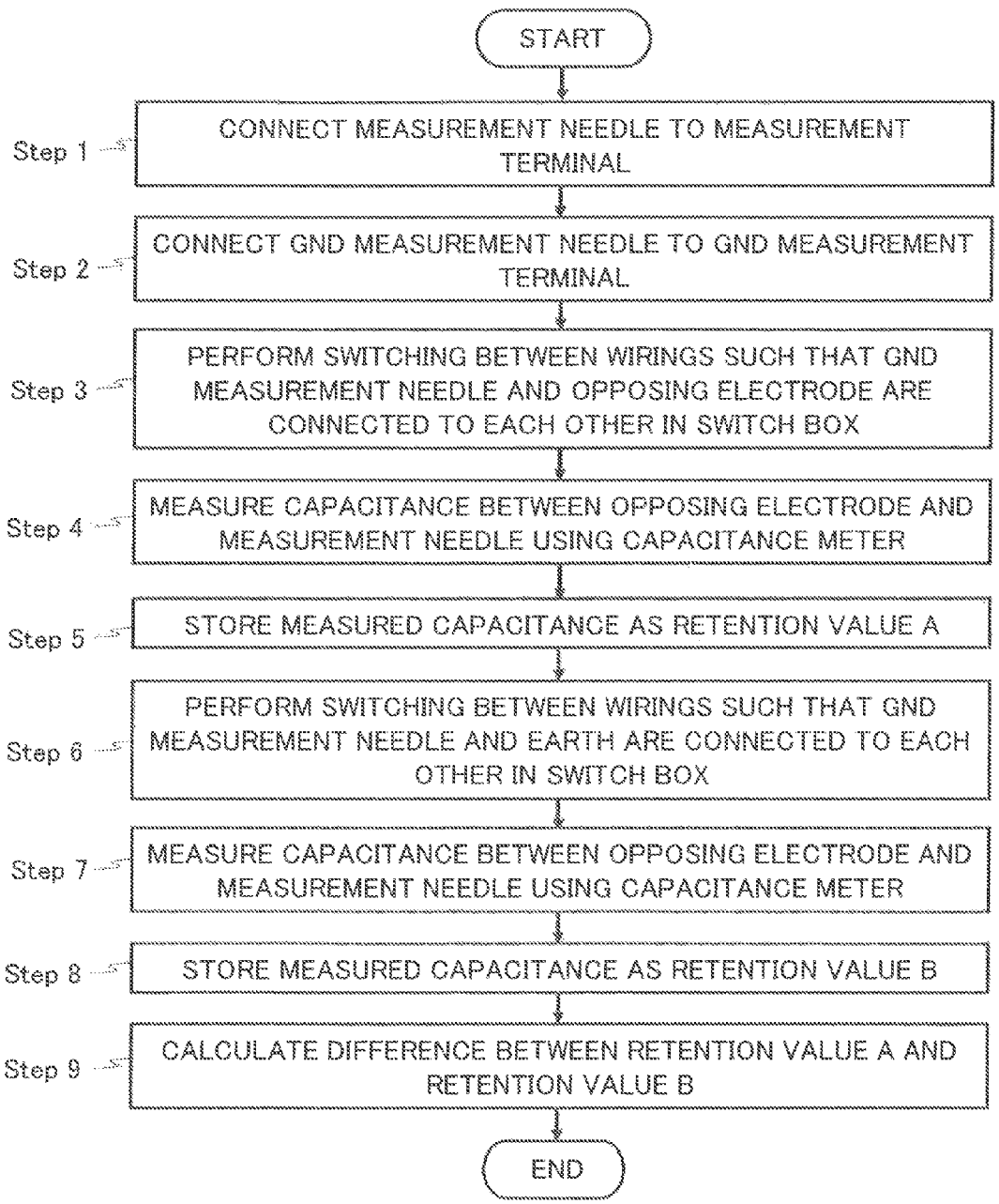
FIG. 2 is a flowchart that illustrates a method of inspecting a wiring board according to a second embodiment of the present invention.

FIG. 2 is a flowchart that illustrates the method of inspecting a wiring board according to the second embodiment of the present invention.

According to the method of inspecting a wiring board according to the second embodiment of the present invention illustrated in FIG. 2, first, the measurement needle 3 of the inspection apparatus 1 illustrated in FIG. 1 is brought into contact with the measurement terminal 14 of the multi-layer wiring board 10 from the tip end side, whereby an electric connection is made (Step 1).

The measurement needle 3 of the inspection apparatus 1 is connected to the capacitance meter 4 on one side, and accordingly, the measurement needle 3 can electrically connect the measurement terminal 14 of the multi-layer wiring board 10 and the capacitance meter 4. In addition, the measurement terminal 14 is disposed on the upper face of the multi-layer wiring board 10 and is electrically connected to the upper layer wiring 12 of the electric wiring 13 inside the board. Accordingly, by electrically connecting the measurement needle 3 to the measurement terminal 14, the capacitance meter 4 can be connected to the electric wiring 13 of the multi-layer wiring board 10.

Next, the GND measurement needle 8 of the inspection apparatus 1 is brought into contact with the GND measurement terminal 16 of the multi-layer wiring board 10 from the tip end side, whereby an electric connection is made (Step 2).

The GND measurement needle 8 of the inspection apparatus 1 is electrically connected to the switch box 5. In addition, the GND measurement terminal 16 is disposed on the upper face of the multi-layer wiring board 10 and is electrically connected to the inner-layer ground layer 15 that is arranged inside the multi-layer wiring board 10. Accordingly, the GND measurement needle 8 is used with the tip end thereof being in contact with the GND measurement terminal 16 of the multi-layer wiring board 10 of the inspection target and electrically connects the switch box 5 and the inner-layer ground layer 15 to each other.

Next, switching between wirings is performed such that the GND measurement needle 8 and the opposing electrode 2 connected to the switch box 5 forms a short circuit so as to be connected inside the switch box 5 by the control process of the control unit 7 (Step 3). In accordance with the switching between wirings performed in this step, the inner-layer ground layer 15 of the multi-layer wiring board 10 is electrically connected to the opposing electrode 2. In other words, through this step, the inspection apparatus 1 can be configured to be in the above-described first connection state in which the inner-layer ground layer 15 of the multi-layer wiring board 10 and the opposing electrode 2 are electrically connected to each other.

Thereafter, capacitance between the opposing electrode 2 and the measurement needle 3 is measured by using the capacitance meter 4 (Step 4).

Here, in the above-described Step 3, in accordance with the switching between wirings inside the switch box 5, a short circuit is formed between the opposing electrode 2 and the GND measurement needle 8, and the inner-layer ground layer 15 of the multi-layer wiring board 10 and the opposing electrode 2 are electrically connected to each other. Accordingly, the measured capacitance value is a combined capacitance of the capacitance C1 generated between the upper layer wiring 12 of the electric wiring 13 and the opposing electrode 2 and the capacitance C2 generated between the lower layer wiring 11 and the inner-layer ground layer 15.

In addition, at this time, capacitance is generated between the upper layer wiring 12 and the inner-layer ground layer 15. However, as described above, the distance between the upper layer wiring 12 and the inner-layer ground layer 15 is much longer than the distance between the lower layer wiring 11 and the inner-layer ground layer 15. Accordingly, the capacitance generated between the upper layer wiring 12 and the inner-layer ground layer 15 is extremely low and therefore can be ignored.

Similarly, capacitance is generated between the lower layer wiring 11 and the opposing electrode 2. However, a distance between the lower layer wiring 11 and the opposing electrode 2 is much longer than a distance between the upper layer wiring 12 and the opposing electrode 2. Accordingly, the capacitance generated between the lower layer wiring 11 and the opposing electrode 2 is extremely low and therefore can be ignored.

Next, the combined capacitance measured in Step 4 described above is stored in the control unit 7 and is set as the retention value A that is the above-described first capacitance (Step 5).

Next, the state in which the measurement needle 3 is connected to the measurement terminal 14 of the electric wiring 13 and the state in which the GND measurement needle 8 is connected to the GND measurement terminal 16 of the inner-layer ground layer 15 are maintained. Then, in the maintained connection state, the switching between wirings is performed such that the GND measurement needle 8 and the earth 6 connected to the switch box 5 form a short circuit inside the switch box 5 so as to be connected to each other by the control process of the control unit 7 (Step 6).

In accordance with the switching between wirings performed in this step, the inner-layer ground layer 15 of the multi-layer wiring board 10 and the earth 6 are electrically connected to each other. In other words, through this step, the inspection apparatus 1 can be configured to be in the above-described second connection state in which the inner-layer ground layer 15 of the multi-layer wiring board 10 and the earth 6 are electrically connected to each other.

Next, capacitance between the opposing electrode 2 and the measurement needle 3 is measured by using the capacitance meter 4 (Step 7).

Here, in accordance with the switching between wirings inside the switch box 5 performed in Step 6 described above, a short circuit is formed between the earth 6 and the GND measurement needle 8, and the inner-layer ground layer 15 of the multi-layer wiring board 10 and the earth 6 are electrically connected to each other. Accordingly, the measured capacitance value is the capacitance C1 generated between the upper layer wiring 12 of the electric wiring 13 and the opposing electrode 2. Since the inner-layer ground layer 15 is connected to the earth 6 through the GND measurement terminal 16 and the GND measurement needle 8, the capacitance C2 generated between the lower layer wiring 11 and the inner-layer ground layer 15 is not measured.

Next, the capacitance measured in Step 7 described above is stored in the control unit 7 and is set as the retention value B that is the second capacitance described above (Step 8).

As described above, the capacitance C2 is zero, and the retention value B stored in the control unit 7 is the capacitance C1 of the upper layer wiring 12 of the electric wiring 13. As a result, the capacitance of the upper layer wiring 12 of the multi-layer wiring board 10 can be acquired.

Next, a difference is calculated using the retention values A and B stored in the control unit 7 (Step 9). In other words, by calculating the difference between the retention value A (C1+C2) and the retention value B (C1), the capacitance C2 of the lower layer wiring 11 of the electric wiring 13 can be extracted. As a result, the capacitance of the lower layer wiring 11 of the multi-layer wiring board 10 is acquired.

Therefore, according to the method of inspecting the wiring board according to this embodiment, capacitance of the multi-layer wiring board 10 having the electric wiring 13 that has the two-layer wiring structure configured by the lower layer wiring 11 and the upper layer wiring 12 can be evaluated in units of layers.

As above, according to the method of inspecting the wiring board according to this embodiment, by measuring capacitance a plurality of times by switching between wiring connections inside the switch box 5 of the inspection apparatus 1 using the capacitance meter 4, capacitance values of the multi-layer wiring board 10 in units of layers can be measured. Then, it can be checked whether or not the measured capacitance values in units of layers after the completion of the wiring board are designated expectation values.

As a result, for example, in a case where a capacitance value of the layer, which has the multi-layer wiring structure, of the wiring board deviates from a designated expectation value or the like, as is necessary, information can be fed back to the manufacturing process of the wiring board. Then, the manufacturing process of the wiring board can be improved and optimized.

Third Embodiment

The inspection apparatus for a wiring board according to the present invention may have a wiring board having a multi-layer wiring structure as an inspection target. In such a case, the wiring board that is an inspection target is not limited to the wiring board having the two-layer wiring structure that has been illustrated in the above-described first and second embodiments but may be a multi-layer wiring board having more wiring layers such as a multi-layer wiring board having a three-layer wiring structure.

Here, an inspection apparatus for a wiring board according to a third embodiment of the present invention that has a wiring board having the three-layer wiring structure as an inspection target will be described with reference to the drawings.

Figure 3:
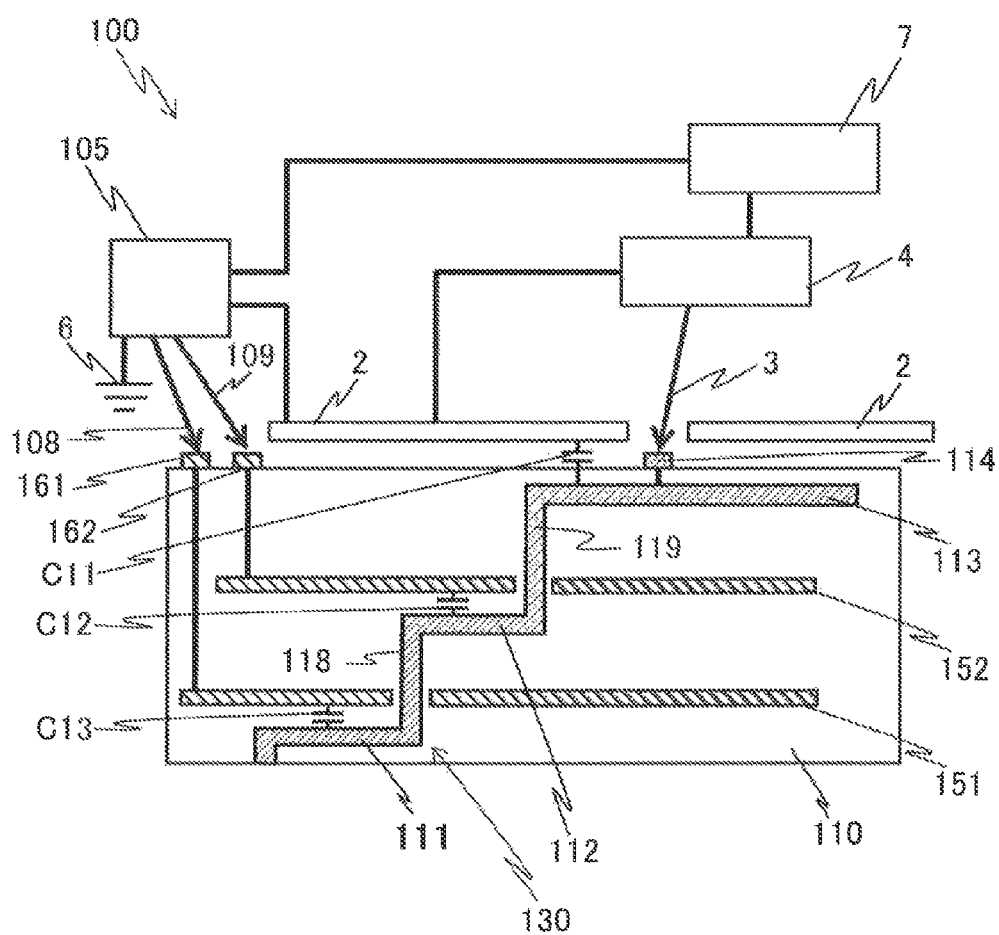
FIG. 3 is a diagram that illustrates the configuration of an inspection apparatus for a wiring board according to a third embodiment of the present invention.
Figure 4:
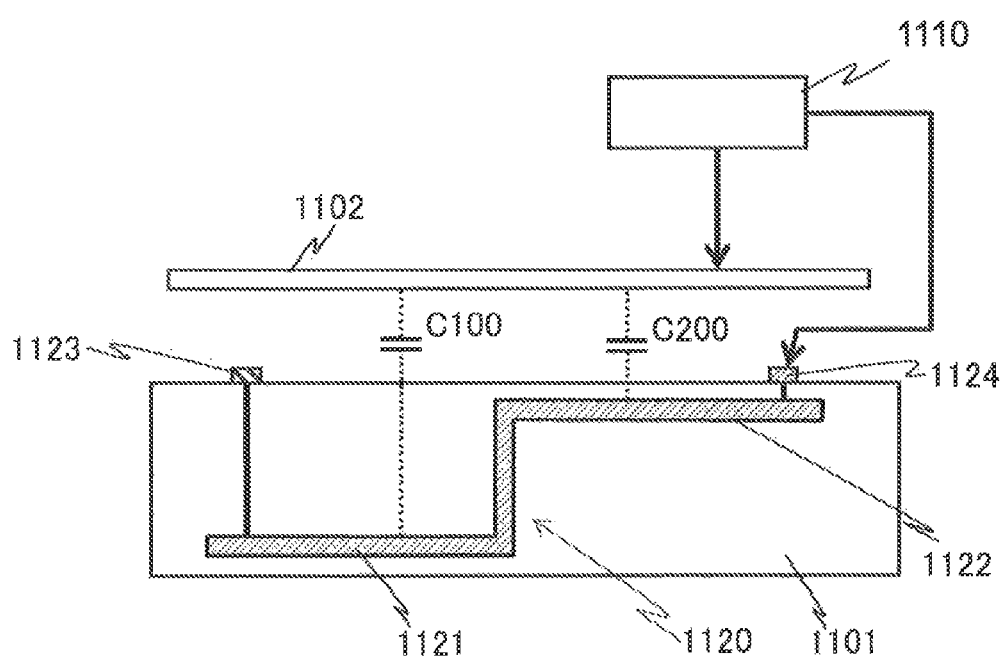
FIG. 4 is a schematic cross-sectional diagram that illustrates a conventional method of inspecting a multi-layer wiring board.

FIG. 3 is a diagram that illustrates the configuration of the inspection apparatus for the wiring board according to the third embodiment of the present invention.

In the inspection apparatus 100 for the wiring board according to the third embodiment of the present invention, the structure of a switch box 105 is different from that of the switch box 5 of the inspection apparatus 1 for the wiring board according to the first embodiment of the prevent invention described above, and the other structure is the same as that of the first embodiment. Thus, in the inspection apparatus 100 for the wiring board according to the third embodiment of the present invention illustrated in FIG. 3, the same reference signs are respectively assigned to constituent elements that are common to the inspection apparatus 1 for the wiring board according to the first embodiment of the present invention, and duplicate descriptions thereof will not be presented.

As illustrated in FIG. 3, the inspection apparatus 100 for the wiring board according to the third embodiment of the present invention may have a multi-layer wiring board 110 having a three-layer wiring structure, which is an example of the multi-layer wiring structure, as an inspection target. The inspection apparatus 100 for the wiring board according to the third embodiment of the present invention is configured to measure capacitance that is a constituent element of the multi-layer wiring board 110 in units of layers configuring the multi-layer wiring board 110 and thus is capable of inspecting the multi-layer wiring board 110.

As illustrated in FIG. 3, the inspection apparatus 100 for the wiring board according to the third embodiment of the present invention is configured to have: an opposing electrode 2; a measurement needle 3; a capacitance meter 4; a switch box 105, an earth 6; a control unit 7; a first GND measurement needle 108; and a second GND measurement needle 109.

The multi-layer wiring board 110 that is an inspection target includes a multi-layer wiring having a multi-layer structure formed by electrically connecting a plurality of mutually-different layers of wirings from the uppermost layer and the lowermost layer and is a wiring board having a multi-layer wiring structure.

More specifically, the multi-layer wiring board 110 includes an electric wiring 130 that is configured by sequentially disposing a first-layer wiring 111, a second-layer wiring 112, and a third-layer wiring 113 from the lower side toward the upper side of the board inside the board and has a three-layer wiring structure. The electric wiring 130 is a multi-layer wiring in which three layers of the first-layer wiring 111, the second-layer wiring 112, and the third-layer wiring 113 of the uppermost layer to the lowermost layer, which are arranged to be apart from one another, and are electrically interconnected through conductive connection portions 118 and 119.

On the upper face of the multi-layer wiring board 110, a measurement terminal 114 is disposed, and the measurement terminal 114 is electrically connected to the third-layer wiring 113 disposed in the uppermost layer of the electric wiring 130 inside the board.

In addition, the multi-layer wiring board 110 includes a plurality of wirings formed inside the board so as to be electrically insulated from the electric wiring 130. The multi-layer wiring board 110 is set as a first inner-layer ground layer 151 and a second inner-layer ground layer 152 that serve as ground wirings using wirings disposed inside the board so as to be electrically insulated from the electric wiring 130. The first inner-layer ground layer 151 and the second inner-layer ground layer 152 are arranged separately to be electrically insulated from the electric wiring 130 near the first-layer wiring 111 and the second-layer wiring 112 other than the third-layer wiring 113 disposed in the uppermost layer of the electric wiring 130. In addition, the first inner-layer ground layer 151 and the second inner-layer ground layer 152 are disposed to be electrically insulated from each other.

The first inner-layer ground layer 151 is arranged near the first-layer wiring 111 so as to be separate therefrom. Accordingly, a distance between the first inner-layer ground layer 151 and the second-layer wiring 112 is much longer than a distance between the first inner-layer ground layer 151 and the first-layer wiring 111. Similarly, a distance between the first inner-layer ground layer 151 and the third-layer wiring 113 is much longer than the distance between the first inner-layer ground layer 151 and the first-layer wiring 111.

Accordingly, capacitance generated between the first inner-layer ground layer 151 and the second-layer wiring 112 is much lower than capacitance generated between the first inner-layer ground layer 151 and the first-layer wiring 111. Similarly, capacitance generated between the first inner-layer ground layer 151 and the third-layer wiring 113 is much lower than the capacitance generated between the first inner-layer ground layer 151 and the first-layer wiring 111.

In addition, the first inner-layer ground layer 151 is electrically connected to a first GND measurement terminal 161 that is disposed on the upper face of the multi-layer wiring board 110.

Furthermore, the second inner-layer ground layer 152 is arranged near the second-layer wiring 112 so as to be separate therefrom. Accordingly, a distance between the second inner-layer ground layer 152 and the third-layer wiring 113 is much longer than a distance between the second inner-layer ground layer 152 and the second-layer wiring 112. Similarly, a distance between the second inner-layer ground layer 152 and the first-layer wiring 111 is much longer than the distance between the second inner-layer ground layer 152 and the second-layer wiring 112.

Accordingly, capacitance generated between the second inner-layer ground layer 152 and the third-layer wiring 113 is much lower than capacitance generated between the second inner-layer ground layer 152 and the second-layer wiring 112. Similarly, capacitance generated between the second inner-layer ground layer 152 and the first-layer wiring 111 is much lower than the capacitance generated between the second inner-layer ground layer 152 and the second-layer wiring 112.

In addition, the second inner-layer ground layer 152 is electrically connected to a second GND measurement terminal 162 that is disposed on the upper face of the multi-layer wiring board 110.

In the inspection apparatus 100 for the wiring board according to this embodiment, the opposing electrode 2 is used while arranged to face the multi-layer wiring board 110. More specifically, the opposing electrode 2 is arranged to face the upper face of the multi-layer wiring board 110. The opposing electrode 2 is formed by using a conductive material having a size sufficiently covering the multi-layer wiring board 110. The opposing electrode 2, for example, is formed using a metal plate. The opposing electrode 2 is electrically connected to the capacitance meter 4.

The measurement needle 3 is used with the tip end thereof being in contact with the electrode. For example, the measurement needle 3 is used while in contact with the measurement terminal 114 of the multi-layer wiring board 110. In addition, the measurement needle 3 is connected to the capacitance meter 4 on one side. Accordingly, the measurement needle 3 can electrically connect the electrode of the inspection target and the capacitance meter 4 to each other.

In the inspection apparatus 100 according to this embodiment, the switch box 105 is configured to switch between wirings so that capacitance can be measured using a desired method. In other words, the switch box 105 is connected to the opposing electrode 2, is connected to the earth 6, and is connected to the first GND measurement needle 108 and the second GND measurement needle 109.

The first GND measurement needle 108 is used with the tip end thereof being in contact with the first GND measurement terminal 161 of the multi-layer wiring board 110 of the inspection target and can electrically connect the switch box 105 and the first inner-layer ground layer 151.

In addition, the second GND measurement needle 109 is used with the tip end thereof being in contact with the second GND measurement terminal 162 of the multi-layer wiring board 110 of the inspection target and can electrically connect the switch box 105 and the second inner-layer ground layer 152.

The switch box 105 is configured to be perform switching to select whether the first GND measurement needle 108 and the second GND measurement needle 109 are independently electrically connected to either the opposing electrode 2 or the earth 6.

Accordingly, the inspection apparatus 100 according to this embodiment can perform switching to select whether the first inner-layer ground layer 151 is electrically connected to either the earth 6 or the opposing electrode 2 independently from the second inner-layer ground layer 152 by using the switch box 105. Similarly, the inspection apparatus 100 according to this embodiment can perform switching to select whether the second inner-layer ground layer 152 is electrically connected to either the earth 6 or the opposing electrode 2 independently from the first inner-layer ground layer 151 by using the switch box 105.

In other words, the switch box 105 of the inspection apparatus 100 according to this embodiment is connected to the first inner-layer ground layer 151, the second inner-layer ground layer 152, the opposing electrode 2, and the earth 6 and can perform switching to select either a first connection state in which both the first inner-layer ground layer 151 and the second inner-layer ground layer 152 are electrically connected to the opposing electrode 2 or a second connection state in which one of the first inner-layer ground layer 151 and the second inner-layer ground layer 152 is electrically connected to the earth 6, and the remaining layer is electrically connected to the opposing electrode 2. In addition, the switch box 105 can perform switching between wirings such that both the first inner-layer ground layer 151 and the second inner-layer ground layer 152 are electrically connected to the earth 6.

In addition, in the inspection apparatus 100 according to this embodiment, the above-described switching between wirings in the switch box 105 is configured so as to be controlled by the control unit 7 to be described below.

The control unit 7 of the inspection apparatus 100 according to this embodiment is connected to the capacitance meter 4 and the switch box 105. The control unit 7 has a function as a control apparatus that controls the above-described switching between wirings in the switch box 105. In addition, the control unit 7 has a function as a storage apparatus that stores capacitance measured by using the capacitance meter 4. Furthermore, the control unit 7 has a function as a difference calculation apparatus that calculates a difference by using predetermined capacitance that is stored and extracts a desired capacitance value.

In other words, the control unit 7 selects the switching between wirings by controlling the switch box 105. As a result, the opposing electrode 2 and the first GND measurement needle 108 are electrically connected to each other, and the first inner-layer ground layer 151 of the multi-layer wiring board 110 and the opposing electrode 2 are electrically connected to each other. At the same time, the control unit 7 performs control of the switch box 105 such that the opposing electrode 2 and the second GND measurement needle 109 are electrically connected, and the second inner-layer ground layer 152 of the multi-layer wiring board 110 and the opposing electrode 2 are electrically connected to each other. As a result, the inspection apparatus 100 can be configured to be in the first connection state in which both the first inner-layer ground layer 151 and the second inner-layer ground layer 152 are electrically connected to the opposing electrode 2 by using the switch box 105.

Then, after the capacitance meter 4 measures the capacitance between the opposing electrode 2 and the electric wiring 130 of the multi-layer wiring board 110 in the first connection state, the control unit 7 sets the acquired capacitance as the first capacitance and, for example, stores the first capacitance as a retention value A2. At this time, the capacitance value stored in the control unit 7 as the retention value A2 is a combined capacitance of capacitance C11 generated between the third-layer wiring 113 of the electric wiring 130 and the opposing electrode 2, capacitance C12 generated between the second-layer wiring 112 and the second inner-layer ground layer 152, and capacitance C13 generated between the first-layer wiring 111 and the first inner-layer ground layer 151. All the other capacitance components such as capacitance generated between the third-layer wiring 113 and the second inner-layer ground layer 152 and capacitance generated between the second-layer wiring 112 and the first inner-layer ground layer 151 are extremely low and can therefore be ignored.

In addition, the control unit 7 performs control of the switch box 105 to select the switching between wirings such that the earth 6 and the first GND measurement needle 108 are electrically connected to each other, and the first inner-layer ground layer 151 of the multi-layer wiring board 110 and the earth 6 are electrically connected to each other. In addition, at the same time, the control unit 7 performs control of the switch box 105 to select the switching between wirings such that the earth 6 and the second GND measurement needle 109 are electrically connected to each other, and the second inner-layer ground layer 152 of the multi-layer wiring board 110 and the earth 6 are electrically connected to each other. As a result, the inspection apparatus 100 can be configured to be in a connection state in which both the first inner-layer ground layer 151 and the second inner-layer ground layer 152 are electrically connected to the earth 6 through the switch box 105.

Then, after the capacitance meter 4 measures the capacitance between the opposing electrode 2 and the electric wiring 130 of the multi-layer wiring board 110 in the first connection state, the control unit 7 stores the acquired capacitance value, for example, as the retention value B2. Since both the capacitance C13 and the capacitance C12 are zero, the retention value B2 stored in the control unit 7 is the capacitance C11 of the third-layer wiring 113 of the electric wiring 130. In other words, the capacitance of the third-layer wiring 113 of the multi-layer wiring board 110 can be acquired.

In addition, the control unit 7 selects the switching between wirings by controlling the switch box 105. As a result, the opposing electrode 2 and the first GND measurement needle 108 are electrically connected to each other, and the first inner-layer ground layer 151 of the multi-layer wiring board 110 and the opposing electrode 2 are electrically connected to each other. Meanwhile, the control unit 7 performs control of the switch box 105 such that the earth 6 and the second GND measurement needle 109 are electrically connected to each other, and the second inner-layer ground layer 152 of the multi-layer wiring board 110 and the earth 6 are electrically connected to each other. As a result, the inspection apparatus 100 can be configured to be in the second connection state in which one of the first inner-layer ground layer 151 and the second inner-layer ground layer 152 is electrically connected to the earth 6, and the remaining layer is electrically connected to the opposing electrode 2 through the switch box 105.

Then, after the capacitance meter 4 measures the capacitance between the opposing electrode 2 and the electric wiring 130 of the multi-layer wiring board 110 in the second connection state, the control unit 7 sets the acquired capacitance value as the second capacitance and stores the second capacitance, for example, as a retention value C2. At this time, the capacitance value stored in the control unit 7 as the retention value C2 is a combined capacitance of capacitance C11 generated between the third-layer wiring 113 of the electric wiring 130 and the opposing electrode 2 and capacitance C13 generated between the first-layer wiring 111 and the first inner-layer ground layer 151.

In addition, the control unit 7 selects the switching between wirings by controlling the switch box 105. As a result, the opposing electrode 2 and the second GND measurement needle 109 are electrically connected to each other, and the second inner-layer ground layer 152 of the multi-layer wiring board 110 and the opposing electrode 2 are electrically connected to each other. Meanwhile, the control unit 7 performs control of the switch box 105 such that the earth 6 and the first GND measurement needle 108 are electrically connected to each other, and the first inner-layer ground layer 151 of the multi-layer wiring board 110 and the earth 6 are electrically connected to each other. As a result, the inspection apparatus 100 can be configured to be in the second connection state in which one of the first inner-layer ground layer 151 and the second inner-layer ground layer 152 is electrically connected to the earth 6, and the remaining layer is electrically connected to the opposing electrode 2 through the switch box 105. More specifically, the second connection state of another example different from the above-described second connection state in which the second inner-layer ground layer 152 is connected to the earth 6 can be formed.

Then, after the capacitance meter 4 measures the capacitance between the opposing electrode 2 and the electric wiring 130 of the multi-layer wiring board 110 in the second connection state of the another example, the control unit 7 sets the acquired capacitance value as the second capacitance and stores the second capacitance, for example, as a retention value D2. At this time, the capacitance value stored in the control unit 7 as the retention value D2 is the second capacitance of another example that is different from the retention value C2 and is a combined capacitance of the capacitance C11 generated between the third-layer wiring 113 of the electric wiring 130 and the opposing electrode 2 and the capacitance C12 generated between the second-layer wiring 112 and the second inner-layer ground layer 152.

Accordingly, the control unit 7 can extract desired capacitance, in other words, the capacitance C12 generated between the second-layer wiring 112 and the second inner-layer ground layer 152 by calculating a difference between the stored retention values A2 and C2 described above. As a result, the inspection apparatus 100 can acquire the capacitance of the second-layer wiring 112 of the multi-layer wiring board 110.

In addition, the control unit 7 can extract desired capacitance, in other words, the capacitance C13 generated between the first-layer wiring 111 and the first inner-layer ground layer 151 by calculating a difference between the stored retention values A2 and D2 described above. As a result, the inspection apparatus 100 can acquire the capacitance of the first-layer wiring 111 of the multi-layer wiring board 110.

In other words, in the inspection apparatus 100, the switch box 105 is configured to perform switching to select one connection state from among the above-described first connection state and a plurality of the second connection states that are different from each other based on whether either the first inner-layer ground layer 151 or the second inner-layer ground layer 152 is electrically connected to the earth 6.

In the measurement of the second capacitance, the inspection apparatus 100 performs switching between wirings using the switch box 105, and the switching between wirings is performed for each one of a plurality of the second connection states that are different from each other based on whether either the first inner-layer ground layer 151 or the second inner-layer ground layer 152 is electrically connected to the earth 6, and a plurality of mutually-different the second capacitance are acquired.

In addition, the extraction of a capacitance value is performed a plurality of times for each one of the plurality of mutually-different second capacitance by using the first capacitance value and the plurality of mutually-different the second capacitance values described above. The inspection apparatus 100 is configured to evaluate capacitance in units of layers of the multi-layer wiring based on a plurality of capacitance values acquired by the extraction that is performed a plurality of times.

The inspection apparatus 100 according to this embodiment having the above-described configuration can measure the capacitance of the multi-layer wiring board 110 having the three-layer wiring structure in units of layers.

Accordingly, the inspection apparatus 100 for a wiring board according to this embodiment measures capacitance a plurality of times by switching between wiring connections inside the switch box 105 using the capacitance meter 4, whereby capacitance values of the multi-layer wiring board 110 in units of layers can be measured. Then, the measured capacitance values can be used for checking whether or not the capacitance values in units of layers after the completion of the wiring board are designated expectation values.

As a result, for example, in a case where a capacitance value of the layer, which has the multi-layer wiring structure, of the wiring board deviates from a designated expectation value or the like, as is necessary, information can be fed back to the manufacturing process of the wiring board. The feedback information may be used for improving and optimizing the manufacturing process of the wiring board.

The present invention is not limited to each embodiment described above, and various changes may be made therein in a range not departing from the concept of the present invention.

For example, there is a case where a multi-layer wiring board that is the inspection target includes wirings of a plurality of mutually-different layers from the uppermost layer to the lowermost layer, and inner-layer ground layers serving as ground wirings are separately arranged near the wirings of the plurality of layers so as to be electrically insulated from one another. In such a case, the multi-layer wiring board can be inspected, for example, by using the uppermost layer of the inner-layer ground layers of the multi-layer wiring board that is the inspection target similar to the opposing electrode 2 of the inspection apparatus 100 for a wiring board according to the third embodiment of the present invention illustrated in FIG. 3.

More specifically, in the case of the multi-layer wiring board 110 illustrated in FIG. 3 as an example, when the multi-layer wiring board 110 includes an inner-layer ground wiring (not illustrated in FIG. 3) that is formed to be equivalent to the second inner-layer ground layer 152 right above the third-layer wiring 113 of the electric wiring 130, the multi-layer wiring board 110 can be inspected by using the inner-layer ground wiring similar to the opposing electrode 2.

In other words, in the inspection apparatus 100, the opposing electrode 2 is configured not to be used, or the inspection apparatus 100 is configured not to include the opposing electrode 2. Then, the switch box 105 is connected to the earth 6, the first GND measurement needle 108, and the second GND measurement needle 109 and is further connected to the inner-layer ground layer arranged right above the third-layer wiring 113.

In addition, the inspection apparatus 100 can evaluate capacitance in units of layers of the multi-layer wiring based on a plurality of capacitance values acquired by a plurality of times of performing extraction by using the same method as described above using the inner-layer ground layer arranged right above the third-layer wiring 113 connected to the switch box 105 instead of the opposing electrode 2.

Accordingly, in the case where the multi-layer wiring board 110 that is an inspection target includes wirings of a plurality of layers, and the inner-layer ground layer is disposed near each wiring of the plurality of wirings, the opposing electrode 2 is not essential to the inspection apparatus 100. Thus, the inspection apparatus 100 performs switching between wirings a plurality of times by using the switch box 105 and measures capacitance in units of layers, for example, for the multi-layer wiring board 110 having the three-layer wiring structure, thereby performing an inspection.

To sum up the description presented above, the features and the advantages of the present invention are as follows.

According to an aspect of the present invention, there is provided an inspection apparatus for a wiring board capable of measuring capacitance in units of layers of a wiring board having a multi-layer wiring structure.

According to another aspect of the present invention, there is provided a method of inspecting a wiring board capable of measuring capacitance in units of layers of the wiring board having a multi-layer wiring structure.

What is claimed is:

1. An inspection apparatus for inspecting a wiring board that includes multiple layers of wiring including electrically connecting wirings of a plurality of mutually-different layers, from an uppermost layer to a lowermost layer, and at least one ground wiring electrically insulated from the multiple layers of wiring and located at a position, wherein distance between one ground wiring and a wiring of the uppermost layer of the multiple layers of wiring is longer than distance between the one ground wiring and another wiring, with the exception of the wiring of the uppermost layer of the multiple layers of wiring, the inspection apparatus comprising:
   an opposing electrode locatable facing a surface of the wiring board closest to the wiring of the uppermost layer;
   a capacitance meter that is electrically connected to the opposing electrode and the multiple layers of wiring and measures capacitance between the opposing electrode and the multiple layers of wiring;
   a ground;
   a switch box that is connected to the at least one ground wiring, the opposing electrode, and the ground, and switching between a first connection state and a second connection state, wherein
      when there is only one ground wiring, in the first connection state the one ground wiring is electrically connected to the opposing electrode, and, in the second connection state, the one ground wiring is electrically connected to the ground, and
      when there is a plurality of ground wirings, in the first connection state, all ground wirings are electrically connected to the opposing electrode, and, in the second connection state, a ground wiring is electrically connected to the ground; and
   a control unit extracting a capacitance value by calculating difference between a first capacitance that is measured in the first connection state by the capacitance meter, and a second capacitance that is measured in the second connection state by the capacitance meter, wherein capacitance in units of layers of the multiple layers of wiring is obtained based on the capacitance value extracted by the control unit.

2. The inspection apparatus according to claim 1, wherein the control unit is connected to the capacitance meter and stores capacitances measured using the capacitance meter.

3. The inspection apparatus according to claim 1, wherein the control unit is connected to the switch box and controls switching of the switch box between the first connection state and the second connection state.

4. The inspection apparatus according to claim 1, wherein the wiring board includes a plurality of the ground wirings, each ground wiring is electrically insulated from the multiple layers of wiring, is located at a position, wherein distance between each ground wiring and the wiring of the uppermost layer of the multiple layers of wiring is longer than distance between each ground wiring and each of the multiple layers of wiring, with the exception of the wiring of the uppermost layer of the multiple layers of wiring,
   the second connection state includes a plurality of connection states in which one ground wiring is electrically connected to the ground, and all other ground wirings are electrically connected to the opposing electrode,
   the switch box switches between the first connection state and the second connection state,
   wherein the second connection state is a state selected from a plurality of connection states in which each ground wiring electrically connected to the ground is mutually different, and
   the control unit extracts the capacitance value by calculating difference between the first capacitance and a capacitance that is measured by the capacitance meter in the second connection that is selected from among a plurality of connection states.

5. The inspection apparatus according to claim 1, wherein the multiple layers of wiring of the wiring boarder have a two-layer wiring structure that includes a lower layer wiring and an upper layer wiring, and one ground wiring disposed at a position, wherein distance between the ground wiring and the upper layer wiring is longer than distance between the ground wiring and the lower layer wiring,
   in the first connection state, one ground wiring is electrically connected to the opposing electrode,
   in the second connection state, the one ground wiring is electrically connected to the ground, and
   the control unit extracts the capacitance value by calculating difference between the first capacitance that is measured in the first connection state and the second capacitance that is measured by the capacitance meter in the second connection state.

6. A method of inspecting a wiring board that includes multiple layers of wiring including electrically connecting wirings of a plurality of mutually-different layers, from an uppermost layer to a lowermost layer, and at least one ground wiring electrically insulated from the multiple layers of wiring, and located at a position, wherein distance between one ground wiring and a wiring of the uppermost layer of the multiple layers of wiring is longer than distance between the one ground wiring and another wiring with the exception of the wiring of the uppermost layer of the multiple layers of wiring, the method comprising:
   disposing an opposing electrode to face a surface of the wiring board closest to the wiring of the uppermost layer;
   switching between a first connection state and a second connection state, wherein
      when there is only one ground wiring, in the first connection state, the one ground wiring is electrically connected to the opposing electrode, and, in the second connection state, the one ground wiring is electrically connected to the ground; and
      when there is a plurality of ground wirings, in the first connection state, all ground wirings are electrically connected to the opposing electrode, and, in the second connection state, a ground wiring is electrically connected to the ground;

measuring a first capacitance in the first connection state;

measuring a second capacitance in the second connection state; and obtaining capacitance in units of layers of the multiple layers of wiring by extracting a capacitance value by calculating difference between the first capacitance and the second capacitance.

7. The method according to claim 6, wherein the wiring board includes a plurality of the ground wirings, and each ground wiring is electrically insulated from the multiple layers of wiring, is located at a position, wherein distance between each ground wiring and the wiring of the uppermost layer of the multiple layers of wiring is longer than distance between each ground wiring and each of the multiple layers of wiring, with the exception of the wiring of the uppermost layer of the multiple layers of wiring, the second connection state includes a plurality of connection states in which one ground wiring is electrically connected to the ground, and all other ground wirings are electrically connected to the opposing electrode, switching between the first connection state and the second connection state, wherein the second connection state is a state selected from a plurality of connection states in which each ground wiring electrically connected to the ground is mutually different, the second capacitance is measured for each one of the second connection states in which each ground wiring electrically connected to the ground is mutually different, by switching, and obtaining a plurality of the second capacitances, and extracting a plurality of the capacitance values using the first capacitance and each one of the second capacitances, and obtaining capacitance in units of layers of the multiple layers of wiring based on the plurality of the capacitance values extracted.

8. The method according to claim 6, wherein the multiple layers of wiring of the wiring board have a two-layer wiring structure including a lower layer wiring and an upper layer wiring, and one ground wiring disposed at a position, wherein distance between the ground wiring and the upper layer wiring is longer than distance between the ground wiring and the lower layer wiring, in the first connection state, the one ground wiring is electrically connected to the opposing electrode, and in the second connection state, the one ground wiring is electrically connected to the ground.

9. An inspection apparatus for inspecting a wiring board that includes (a) multiple layers of wiring including a first wiring layer, a second wiring layer, and an electrical connection of the first wiring layer to the second wiring layer, and (b) a ground wiring electrically insulated from the multiple layers of wiring and located between the first and second wiring layers and closer to the first wiring layer than to the second wiring layer, the inspection apparatus comprising:

an opposing electrode locatable facing a surface of the wiring board closest to the second wiring layer;

a capacitance meter that is electrically connectable to the opposing electrode and to the first and second wiring layers and measuring capacitances between the opposing electrode and the multiple layers of wiring;

a ground;

a switch box that is connected to the ground wiring, the opposing electrode, and the ground, and switching between a first connection state and a second connection state, wherein, in the first connection state the ground wiring is electrically connected to the opposing electrode, and, in the second connection state, the ground wiring is electrically connected to the ground; and a control unit extracting a capacitance value by calculating a difference between a first capacitance measured by the capacitance meter in the first connection state, and a second capacitance measured by the capacitance meter in the second connection state, wherein capacitance of each layer of the multiple layers of wiring is obtained based on the capacitance value extracted by the control unit.

10. An inspection apparatus for inspecting a wiring board that includes (a) multiple layers of wiring including a first wiring layer, a second wiring layer, a third wiring layer, and an electrical connection of the first, second, and third wiring layers to each other, and (b) a first ground wiring electrically insulated from the multiple layers of wiring and located between the first and second wiring layers and closer to the first wiring layer than to either of the second and third wiring layers, and a second ground wiring electrically insulated from the multiple layers of wiring and located between the second and third wiring layers and closer to the second wiring layer than to either of the first and third wiring layers, the inspection apparatus comprising:

an opposing electrode locatable facing a surface of the wiring board closest to the third wiring layer;

a capacitance meter that is electrically connectable to the opposing electrode and the first, second, and third wiring layers and measuring capacitances between the opposing electrode and the multiple layers of wiring;

a ground;

a switch box that is connected to the first and second ground wirings, the opposing electrode, and the ground, and switching between a first connection state and a second connection state, wherein, in the first connection state both the first ground wiring and the second ground wiring are electrically connected to the opposing electrode, and, in the second connection state either the first ground wiring or the second ground wiring is electrically connected to the ground, and the one of the first and second ground wirings that is not connected to the ground is electrically connected to the opposing electrode; and a control unit extracting a capacitance value by calculating a difference between a first capacitance measured by the capacitance meter in the first connection state, and a second capacitance measured by the capacitance meter in the second connection state, wherein capacitance of each layer of the multiple layers of wiring is obtained based on the capacitance value extracted by the control unit.

11. A method for inspecting a wiring board that includes (a) multiple layers of wiring including a first wiring layer, a second wiring layer, and an electrical connection of the first wiring layer to the second wiring layer, and (b) a ground wiring electrically insulated from the multiple layers of wiring and located between the first and second wiring layers and closer to the first wiring layer than to the second wiring layer, the inspection method comprising:

disposing an opposing electrode facing a surface of the wiring board closest to the second wiring layer;

switching between a first connection state and a second connection state, wherein, in the first connection state the ground wiring is electrically connected to the opposing electrode, and, in the second connection state the ground wiring is electrically connected to the ground;

measuring a first capacitance in the first connection state;

measuring a second capacitance in the second connection state;

extracting a capacitance value by calculating a difference between the first capacitance and the second capacitance; and obtaining capacitance of each layer of the multiple layers of wiring based on the capacitance value.

12. A method for inspecting a wiring board that includes (a) multiple layers of wiring including a first wiring layer, a second wiring layer, a third wiring layer, and an electrical connection of the first, second, and third wiring layers to each other, and (b) a first ground wiring electrically insulated from the multiple layers of wiring and located between the first and second wiring layers and closer to the first wiring layer than to the second and third wiring layers, and a second ground wiring electrically insulated from the multiple layers of wiring and located between the second and third wiring layers and closer to the second wiring layer than to the first and third wiring layers, the inspection method comprising:

disposing an opposing electrode facing a surface of the wiring board closest to the third wiring layer;

switching between a first connection state and a second connection state, wherein, in the first connection state both the first ground wiring and the second ground wiring are electrically connected to the opposing electrode, and, in the second connection state either the first ground wiring or the second ground wiring is electrically connected to the ground, and the one of the first ground wiring and the second ground wiring that is not connected to the ground is electrically connected to the opposing electrode;

measuring a first capacitance in the first connection state;

measuring a second capacitance in the second connection state;

extracting a capacitance value of the one of the first and second wiring layers that is located closest to the one of the first and second ground wiring that is electrically connected to the ground in the second connection state, by calculating a difference between the first capacitance and the second capacitance; and obtaining capacitance of each layer of the multiple layers of wiring based on the capacitance value.

\* \* \* \* \*